United States Patent [19]
Takahashi

[11] Patent Number: 5,933,373
[45] Date of Patent: Aug. 3, 1999

[54] SEMICONDUCTOR MEMORY DEVICE HAVING CONSTANT POTENTIAL GENERATOR FOR CLAMPING DIGIT LINES AT CONSTANT LEVEL ALLOWING PRECHARGE TRANSISTOR TO SLIGHTLY TURN ON

[75] Inventor: Hiroyuki Takahashi, Tokyo, Japan

[73] Assignee: NEC Corporation, Tokyo, Japan

[21] Appl. No.: 08/919,479

[22] Filed: Aug. 28, 1997

[30] Foreign Application Priority Data

Aug. 29, 1996 [JP] Japan ..................................... 8-229123

[51] Int. Cl.$^6$ ..................................................... G11C 7/00

[52] U.S. Cl. ................................ 365/189.06; 365/189.09; 365/203; 365/202; 365/204

[58] Field of Search ........................ 365/189.06, 189.09, 365/203, 202, 204

[56] References Cited

U.S. PATENT DOCUMENTS 4,975,879 12/1990 Auvinen .............................. 365/189.09
5,157,631 10/1992 Shimogawa .............................. 365/203

FOREIGN PATENT DOCUMENTS 3-205693 9/1991 Japan .

Primary Examiner—Andrew Q. Tran
Attorney, Agent, or Firm—Foley & Lardner

[57] ABSTRACT

Digit line pairs of a static random access memory device are charged by n-channel enhancement type charge transistors and clamped at an intermediate potential level between a positive power potential level and a ground level by p-channel type clamping transistors after a data read-out and a data write-n, and the p-channel type clamping transistors are gated by column selecting signals so as to be changed between on-state and off-state complementarily to n-channel enhancement type transfer transistors connected between the digit line pairs and a data bus, thereby recovering the digit line pairs to the intermediate potential level.

18 Claims, 6 Drawing Sheets

SEMICONDUCTOR MEMORY DEVICE HAVING CONSTANT POTENTIAL GENERATOR FOR CLAMPING DIGIT LINES AT CONSTANT LEVEL ALLOWING PRECHARGE TRANSISTOR TO SLIGHTLY TURN ON

FIELD OF THE INVENTION

This invention relates to a semiconductor memory device and, more particularly, to a semiconductor memory device having a constant potential generator supplying a constant potential level through a clamping circuit to digit lines for allowing precharge transistors to slightly turn on.

DESCRIPTION OF THE RELATED ART

When a data bit is read out from a high-speed semiconductor memory device, digit line pairs are electrically connected to memory cells with the same row address, and, thereafter, the digit line pairs are selectively connected through a selector to a bus line. After the read-out, a precharging circuit changes the digit line pairs to a certain precharge level for the next data access. Thus, the selector and the precharging circuit operate on all the digit line pairs, and, accordingly, occupy an area as wide as the area assigned to the digit line pairs. For this reason, when the manufacturer increases the memory cells and, accordingly, the digit line pairs, the precharging circuit and the selector are enlarged together with the memory cell array, and occupy a wide area. Manufacturers are making research and development efforts on a high-speed large storage capacity semiconductor memory device fabricated on a relatively small semiconductor chip.

FIG. 1 illustrates a typical example of the high-speed static random access memory device. The prior art high-speed static random access memory device comprises a memory cell array 1 having memory cells MC arranged in rows and columns, and the memory cells MC are implemented by a flip flop circuit. Word lines WL1 to WLm are respectively connected to the rows of memory cells MC, and digit line pairs D1/D1B to Dn/DnB are respectively connected to the columns of memory cells MC. When one of the word lines WL1 to WLm is changed to an active level, the memory cells MC of the associated row are electrically connected to the digit line pairs D1/D1B to Dn/DnB, and data bits are read out from the memory cells MC to the digit line pairs D1/D1B to Dn/DnB in the form of potential difference.

The prior art high-speed static random access memory device further comprises a precharging circuit 2 for charging the digit line pairs D1/D1B to Dn/DnB to a precharge level. The precharging circuit 2 includes precharging units 21 to 2n respectively connected between a positive power voltage line VCC and the digit line pairs D1/D1B to Dn/DnB. The precharging units 21 to 2n are identical in circuit configuration with one another, and each precharging unit 21/2n has a pair of charge transistors M3/M4 connected between the positive power voltage line VCC and the digit lines of the associated pair and a balance transistor M5 connected between the digit lines of the associated pair. A precharge control line PCL is connected to the gate electrodes of the charge transistors M3/M4 and the gate electrode of the balance transistor M5, and the charge transistors M3/M4 and the balance transistor M5 are concurrently changed between on state and off state. When the charge transistors M3/M4 and the balance transistor M5 are turned on, the associated bit lines are charged to and balanced at the precharge level.

In this instance, the precharge level is lower than a positive power voltage level Vcc by the threshold of the precharge transistors M3/M4.

The prior art high-speed static random access memory device further comprises a clamping circuit 3, and the clamping circuit 3 includes clamping units Yc1 to Ycn respectively associated with the digit line pairs D1/D1B to Dn/DnB. The clamping units Yc1 to Ycn are identical in circuit configuration with one another, and each of the clamping units Yc1 to Ycn is implemented by a pair of clamping transistors M46/M47. The clamping transistors M46/M47 are connected between the positive power voltage line VCC and the digit lines of the associated pair, and the gate electrodes of the clamping transistors M46/M47 are connected to the positive power voltage line VCC. For this reason, the clamping transistors M46/M47 are turned on at all times, and electrically connect the positive power voltage line VCC to the associated digit lines.

The prior art high-speed static random access memory device further comprises, a data bus RB/RBB, a column selector 4 connected between the digit line pairs D1/D1B to Dn/DnB and the data bus RB/RBB and a sense amplifier/write-in circuit 5 connected to the data bus RB/RBB. The column selector 4 includes pairs of transfer transistors M1/M2 connected between the digit line pairs D1/D1B to Dn/DnB and the data bus RB/RBB, and the pairs of transfer transistors M1/M2 selectively connect the digit line pairs D1/D1B to Dn/DnB to the data bus RB/RBB under the control of selecting lines Y1 to Yn. Then, one of the digit line pairs D1/D1B to Dn/DnB is connected through the associated pair of transfer transistors M1/M2 to the data bus RB/RBB, and the read-out data bit is transferred from the selected digit line pair through the data bus RB/RBB to the sense amplifier/write-in circuit 5.

The precharging circuit 2, the clamping circuit 3 and the column selector 4 form parts of a peripheral circuit of the prior art high-speed static random access memory device.

The prior art high-speed static random access memory device behaves as follows. The left memory cell MC is assumed to be accessed. The digit lines D1 to Dn have been balanced with the digit lines D1B to DnB. The word line WL1 is changed to the active level, and the memory cells MC in the associated row are electrically connected to the digit line pairs D1/D1B to Dn/DnB. Current flows from either digit line D1/ . . . /Dn or D1B/ . . . /DnB to each of the associated memory cells MC. As a result, potential differences take place on the digit line pairs D1/D1B to Dn/DnB.

Subsequently, the selecting line Y1 is changed to the active level, and the other selecting lines remain inactive. Then, the leftmost pair of transfer transistors M1/M2 turns on, and the digit line pair D1/D1B is electrically connected through the pair of transfer transistors M1/M2 to the data bus RB/RBB. The potential difference is propagated from the digit line pair D1/D1B through the pair of transfer transistors M1/M2 to the data bus RB/RBB.

The sense amplifier 5 quickly increases the magnitude of the potential difference on the data bus RB/RBB, and an output data signal is produced from the large potential difference.

The potential difference on the digit line pairs D1/D1B to Dn/DnB are zero immediately before the selection of the row of memory cells. After the selection, it is preferable to minimize the current driving capability of the precharging circuit 2. For this reason, the precharge control line PCL is changed to the inactive level immediately before the selection of the row of memory cells MC, so that the precharge transistors M3/M4 and the balance transistor M5 turn off. The precharge control line PCL is shared between all of the precharging units 21 to 2n, and the digit line pairs D1/D1B to Dn/DnB are concurrently isolated from the positive power voltage line VCC. However, the clamping transistors M46/M47 are continuously turned on after the change of the precharge control line PCL to the inactive level. For this reason, the adjacent digit line pairs D1/D1B to Dn/DnB are hardly affected by noise. Moreover, the clamping transistors M46 or M47 pull up the associated digit lines D1–Dn/D1B–DnB to the high level, and the clamping transistors M47 or M46 prevent the associated digit lines D1B–DnB/D1–Dn from an excessively low level due to the current flowing into the memory cells MC. Thus, the clamping transistors M46/M47 allow the selected word line to remain in the active level for a long time period, and the prior art static random access memory device copes with a long data access cycle. Of course, if a narrow pulse signal is supplied to the selected word line, the prior art static random access memory device also copes with the long data access cycle.

When a data bit is written into the leftmost memory cell MC, the leftmost memory cell MC is specified by selecting the word line WL1 and the column selecting line Y1 as similar to the data read-out, and the precharge transistors M3/M4 and the balance transistor M5 turn off immediately before the selection. The write-in circuit 5 drops one of the bus lines of the data bus RB/RBB to the lowest level, i.e., the ground level depending upon the write-in data bit, and a potential difference takes place on the data bus RB/RBB. The potential difference is propagated through the transfer transistors M1/M2 to the digit line pair D1/D1B, and the potential difference on the digit line pair D1/D1B maintains or changes the stable state in the flip flop of the left-most memory cell MC.

The data write-in speed is determined by the potential decay on the digit line and the recovery after the data write-in. In this instance, the precharge transistors M3/M4 are of the n-channel enhancement type, and the digit lines pairs D1/D1B to Dn/DnB are charged to and balanced at the potential level lower than the positive power voltage level Vcc by the threshold Vtn of the precharge transistors M3/M4, i.e., Vcc–Vtn. For this reason, the memory cell MC swings the potential level on the digit lines D1/D1B to Dn/DnB in the potential range narrower than those precharged to the positive power voltage level Vcc, and the narrow potential range improves the access speed. The charging circuit 2 varies the current driving capability with the precharge control line PCL, and changes the speed between the potential decay and the potential recovery. This control further improves the access speed.

Another reason why the digit line pairs D1/D1B to Dn/DnB are charged to the potential level (Vcc–Vtn) is reduction of the number of circuit components of the peripheral circuit. In detail, when the potential difference is developed on the digit line pair D1/D1B to Dn/DnB, one of the digit lines of the pair is lower than the other digit line of the pair by hundreds of milli-volts, and the transfer transistors M1/M2 of the n-channel enhancement type can transfer the potential difference to the data bus RB/RBB, because the source-to-gate potential is large enough to make the transfer transistors M1/M2 the on-state. Thus, the digit line pair is associated with the seven transistors M1/M2, M3/M4, M5 and M46/M47.

The prior art high-speed static random access memory device encounters a problem in that the access speed reaches the upper limit and the data access is hardly accelerated. This is because of the fact that the clamping circuit 3 continuously supplies current to the digit lines D1/D1B to Dn/DnB. The flip flop circuit of the memory cell MC is expected to discharge not only the current supplied through the clamping circuit 3 but also a large amount of parasitic capacitance coupled to the associated digit line. Thus, the clamping circuit 3 slows down the development of the potential differences on the digit line pairs D1/DB to Dn/DnB.

A coupling capacitance between the adjacent digit lines is another reason why the data access is hardly accelerated. After the data write-in, the precharging circuit 2 pulls up the digit line decayed to the low level, and the potential rise on the digit line causes the adjacent digit line capacitively coupled thereto to raise the potential level thereon, and an offset potential difference takes place on the adjacent digit line pair. In this situation, if a data bit opposite in logic level to the offset potential difference is read out from a memory cell to the digit line pair, time delay is serious.

Another problem is a malfunction due to potential fluctuation on the positive power supply line VCC. The precharge control signal PCL and the column selecting signals Y1 to Yn are produced from the positive power voltage Vcc, and the potential fluctuation affects the potential level of these signals PCL and Y1 to Yn. When the precharge control signal PCL and the column selecting signals Y1 to Yn are widely decayed, the gate potential can not maintain the threshold of the precharge/transfer transistor, and the precharge/transfer transistor turns off. As a result, the data read-out becomes impossible.

SUMMARY OF THE INVENTION

It is therefore an important object of the present invention to provide a semiconductor memory device which is improved in access speed and less affected by the potential fluctuation.

To accomplish the object, the present invention proposes to supply a constant potential through clamping transistors opposite in channel conductivity type to transfer transistors and gated with column selecting lines to digit line pairs.

In accordance with one aspect of the present invention, there is provided a semiconductor memory device comprising a plurality of memory cells for storing data bits, a plurality of word lines selectively connected to said plurality of memory cells for selecting memory cells from said plurality of memory cells, a plurality of digit line pairs selectively connected to said plurality of memory cells for propagating potential differences representative of data bits from and to said memory cells, a data bus electrically connectable to one of said plurality of digit line pairs, and a peripheral circuit associated with said plurality of digit line pairs for reading our said data bits from and writing said data bits into said memory cells, and the peripheral circuit includes a column selector having first transistors of a first channel conductivity type connected between the digit lines of said plurality of digit line pairs and said data bus and gated by column selecting signals for connecting one of said plurality of digit line pairs to said data bus, and a clamping circuit having second transistors of a second channel conductivity type opposite to said first channel conductivity type, connected between said digit lines of said plurality of digit line pairs and a constant potential line and gated by said column selecting signals so that the first transistors and the second transistors complementarily turn on and off.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENTS

First Embodiment

Figure 2:
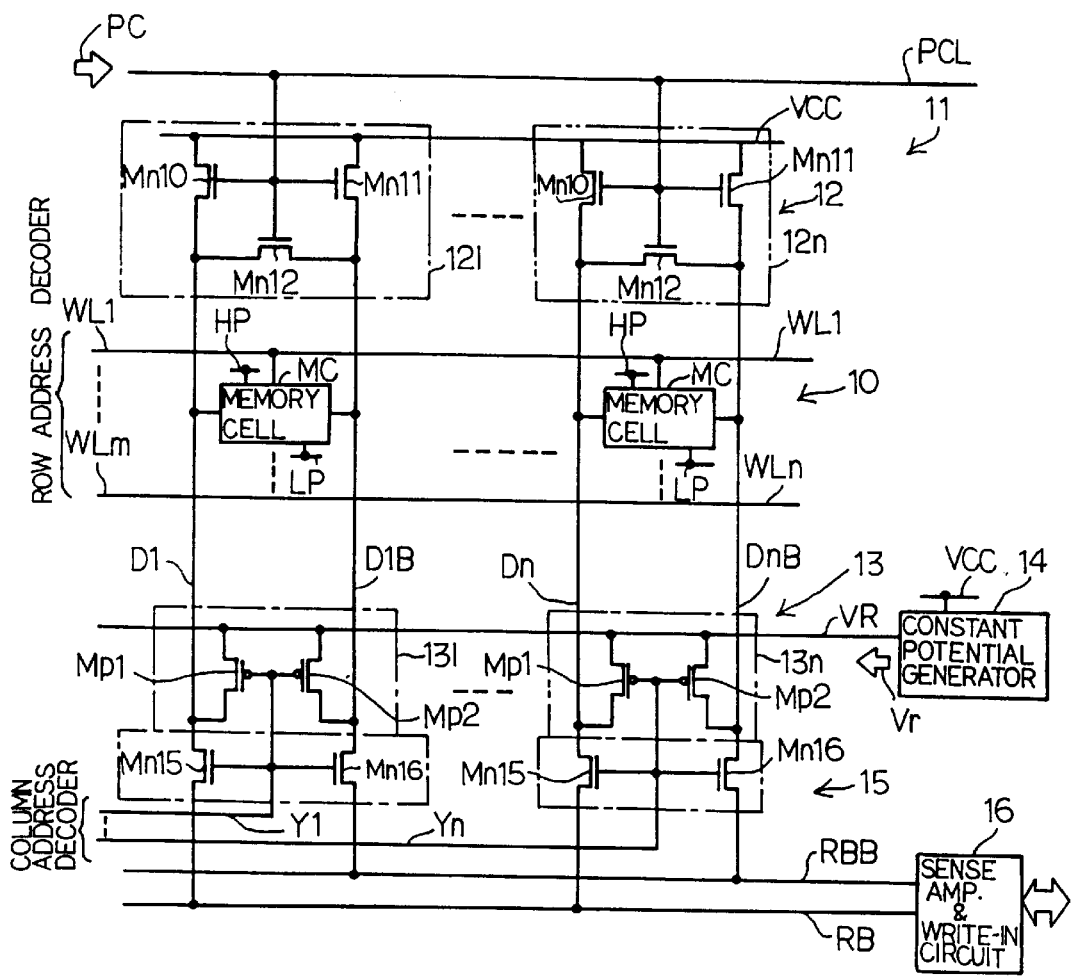
FIG. 2 is a circuit diagram showing the arrangement of a static random access memory device according to the present invention.

Referring to FIG. 2 of the drawings, a static random access memory device embodying the present invention is fabricated on a single semiconductor chip, and largely comprises a memory cell array 10, word lines W11 to WLn, digit line pairs D1/D1B to Dn/DnB and a peripheral circuit 11. The memory cell array 10 includes a plurality of memory cells MC arranged in rows and columns, and a flip flop circuit and a pair of n-channel enhancement type access transistors form in combination each of the memory cells MC. The word lines WL1 to WLm are respectively connected to the rows of memory cells MC, and digit line pairs D1/D1B to Dn/DnB are respectively connected to the columns of memory cells MC. When one of the word lines WL1 to WLm is changed to an active level, the memory cells MC of the associated row are electrically connected to the digit line pairs D1/D1B to Dn/DnB, and data bits are read out from the memory cells MC to the digit line pairs D1/D1B to Dn/DnB in the form of potential difference.

Though not shown in the drawings, the flip flop circuit is implemented by a first series of a load element, a first memory node and a first n-channel enhancement type switching transistor and a second series of a load element, a second memory node and a second n-channel enhancement type switching transistor coupled in parallel between a high potential line HP and a low potential line LP, and the first memory node and the second memory node are connected to the gate electrode of the second n-channel enhancement type switching transistor and the gate electrode of the first n-channel enhancement type switching transistor, respectively. One of the first and second n-channel enhancement type switching transistors is turned on so as to connect the associated memory node to the low potential line, and the other is turned off so as to allow the high potential line HP to charge the other memory node. For this reason, the memory cell MC stores a data bit in the form of a potential difference between the first memory node and the second memory node. The n-channel enhancement type access transistors connected between the digit lines of the associated pair and the first/second memory nodes, and are concurrently gated by the associated word line. In this instance, the high potential line HP supplies the positive power potential level Vcc to said memory cells.

The peripheral circuit 11 includes a precharging circuit 12 for charging the digit line pairs D1/D1B to Dn/DnB to a precharge level. The precharging circuit 12 includes precharging units 121 to 12n connected between a positive power voltage line VCC and the digit line pairs D1/D1B to Dn/DnB, and the positive power voltage line VCC supplies the positive power voltage level Vcc to the precharging units 121 to 12n.

The precharging units 121 to 12n are identical in circuit configuration with one another, and each precharging unit 121/12n has a pair of n-channel enhancement type charge transistors Mn10/Mn11 connected between the positive power voltage line VCC and the digit lines of the associated pair and an n-channel enhancement type balance transistor Mn12 connected between the digit lines of the associated pair. A precharge control line PCL is connected to the gate electrodes of the n-channel enhancement type charge transistors Mn10/Mn11 and the gate electrode of the n-channel enhancement type balance transistor Mn12, and a precharge control signal PC of active high level concurrently change the charge transistors Mn10/Mn11 and the balance transistor Mn12 from off state to on state. When the n-channel enhancement type charge transistors Mn10/Mn11 and the n-channel enhancement type balance transistor Mn12 turn on, the associated bit lines are charged to and balanced at the precharge level. Although the n-channel enhancement type charge transistors Mn10/Mn11 can charge the digit lines D1/D1B to Dn/DnB to a potential level lower than a positive power voltage level Vcc by the threshold Vtn thereof. However, the digit lines D1/D1B to Dn/DnB are slightly pulled down from the potential level (Vcc−Vtn) as will be described hereinlater.

The peripheral circuit 11 further includes a clamping circuit 13 and a constant potential generator 14, and the clamping circuit 13 includes clamping units 131 to 13n respectively associated with the digit line pairs D1/D1B to Dn/DnB. The clamping units 131 to 13n are identical in circuit configuration with one another, and each of the clamping units 131 to 13n is implemented by a pair of p-channel enhancement type clamping transistors Mp1/Mp2. The clamping transistors Mp1/Mp2 are connected between a constant potential line VR and the digit lines of the associated pair, and the gate electrodes of the clamping transistors Mp1/Mp2 of the clamping units 131 to 13n are respectively connected to column selecting lines Y1 to Yn. The constant potential line VR is connected to the constant potential generator 14, and the constant potential generator 14 supplies a constant potential level Vr slightly lower than the potential level (Vcc−Vtn). The clamping circuit 12 connects the digit line pairs D1/D1B to Dn/DnB to the constant potential line VR, and the digit line pairs D1/D1B to Dn/DnB become equal to the constant potential level Vr.

Figure 3:
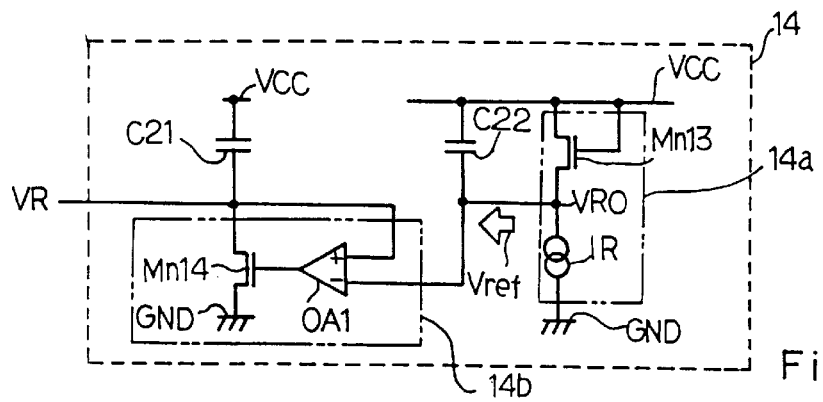
FIG. 3 is a circuit diagram showing the circuit arrangement of a constant power generating circuit of the static random access memory device.

FIG. 3 illustrates the circuit configuration of the constant potential generator 14. The constant potential generator 14 is broken down into a reference potential generator 14a, a potential regulator 14b and two capacitors C21 and C22.

The reference potential generator 14a includes an n-channel enhancement type load transistor Mn13 connected between the positive power voltage line VCC and a reference node VR0 and a constant current source IR connected between the reference node VR0 and the ground line GND. The positive power voltage line VCC is further connected to the n-channel enhancement type load transistor Mn13, and the n-channel enhancement type load transistor Mn13 serves as a diode. The n-channel enhancement type load transistor Mn13 maintains the reference node VR0 at a constant potential level Vref.

The potential regulator 14b includes an n-channel enhancement type discharge transistor Mn14 connected between the constant potential line VR and the ground line GND and an operational amplifier OA1 for controlling the channel conductance of the n-channel enhancement type discharge transistor Mn14. The operational amplifier OA1 has an inverted node (−) connected to the reference node VR0 and a non-inverted node (+) connected to the constant potential line VR, and compares the potential level on the constant potential line VR with the constant potential level Vref to see whether or not the constant potential level Vr is undesirably varied. The output node of the operational amplifier OA1 is connected to the gate electrode of the n-channel enhancement type discharge transistor Mn14.

When the constant potential level Vr rises, the operational amplifier OA1 increases the potential level at the output node thereof, and enhances the channel conductance of the n-channel enhancement type discharge transistor Mn14. Then, the constant potential level Vr is decayed. On the other hand, when the constant potential level Vr is decayed, the operational amplifier OA1 decreases the potential level at the output node thereof, and the n-channel enhancement type discharge transistor Mn14 decreases the channel conductance. As a result, the constant potential level Vr is increased.

The capacitors C21 is connected between the positive power voltage line VCC and the constant potential line VR, and the other capacitor C22 is connected between the positive power voltage line VCC and the reference node VR0. The capacitors C21 and C22 cause the constant potential level Vr and the reference potential level Vref to follow the positive power voltage level Vcc.

The constant potential line VR is connected through the p-channel enhancement type clamping transistors Mp1/Mp2 to the digit lines of the associated pair D1/D1B/ . . . /Dn/DnB, and the digit lines D1/D1B to Dn/DnB are connected through the n-channel enhancement type charge transistors Mn10/Mn11 equivalent to diode-coupled transistors to the positive power supply line VCC. The other digit line pairs are similarly connected between the constant potential line VR and the positive power supply line VCC, and the n-channel enhancement type charge transistors Mn10/Mn11 of the precharging circuit 12 are equivalent to an extremely large field effect transistor. However, when the digit lines D1/D1B to Dn/DnB are charged to the precharge level, the p-channel enhancement type clamping transistor Mp1/Mp2 is much smaller in impedance than the n-channel enhancement type charge transistor Mn10/Mn11, and the load characteristics are almost dominated by the n-channel enhancement type charge transistors Mn10/Mn11. The n-channel enhancement type discharging transistor Mn14 causes a small amount of current to flow from the digit lines D1/D1B to Dn/DnB to the ground line GND, and the potential level on the digit lines D1/D1B to Dn/DnB are regulated to the precharge level slightly lower than the potential level (Vcc−Vtn). As a result, the n-channel enhancement type charge transistors Mn10/Mn11 slightly turn on, and create the channels with small conductance.

Figure 4:
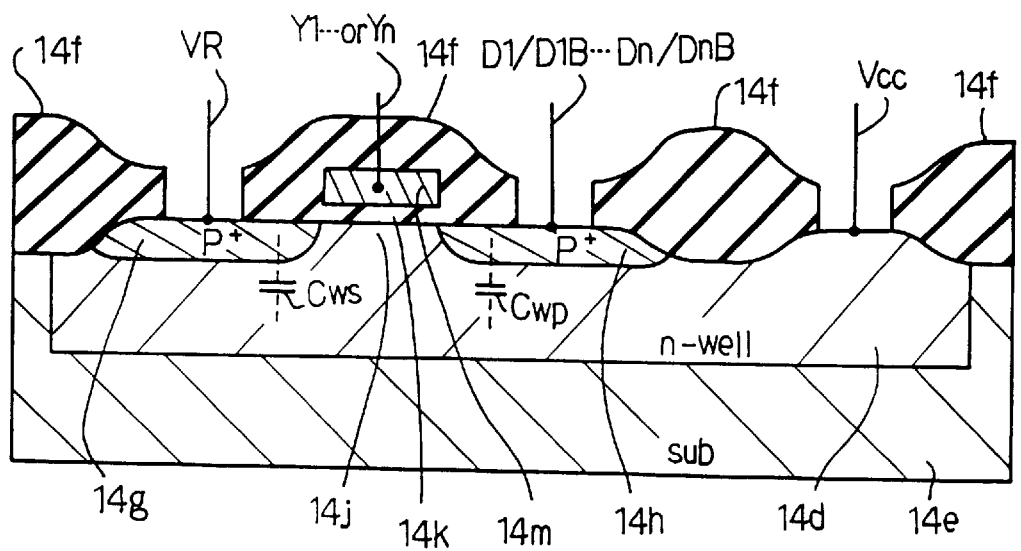
FIG. 4 is a cross sectional view showing a clamping transistor.

FIG. 4 illustrates the structure of the p-channel enhancement type clamping transistor Mp1/Mp2. An n-type well 14d is formed in a surface portion of the p-type semiconductor substrate 14e, and the n-type well 14d is covered with an insulating layer 14f. A heavily doped source region 14g and a heavily doped drain region 14h are formed in the n-type well 14d, and a channel region 14j spaces the heavily doped source region 14g from the heavily doped drain region 14h. The channel region 14j is covered with a gate insulating layer 14k, and a gate electrode 14m is formed on the gate insulating layer 14k.

The heavily doped p-type source region 14g and the heavily doped n-type drain region 14h are connected to the constant potential line VR and the digit line D1/D1B/Dn/DnB, and the gate electrode 14m is connected to the column selecting line Y1/ . . . /Yn. The n-type well 14d is connected to the positive power supply line VCC, and the p-n junctions between the heavily doped p-type source/drain regions 14g/14h and the n-type well 14d are reversely biased, and depletion layers extend from the p-n junctions. The depletion layers form junction capacitors Cws and Cwd. The junction capacitor Cws is available for the capacitor C21. If a suitable capacitor is further connected to the constant potential line VR, the additional capacitor further enhances the stability. Although the constant potential generator 14 further requires the capacitor C22, the reference node VR0 is small in capacitance, and the capacitor C22 does not require large capacitance.

The peripheral circuit 11 further includes a data bus RB/RBB, a column selector 15 connected between the digit line pairs D1/D1B to Dn/DnB and the data bus RB/RBB and a sense amplifier/write-in circuit 16 connected to the data bus RB/RBB. The column selector 15 includes pairs of n-channel enhancement type transfer transistors Mn15/Mn16 connected between the digit line pairs D1/D1B to Dn/DnB and the data bus RB/RBB. The pairs of n-channel enhancement type transfer transistors Mn15/Mn16 are gated by the column selecting lines Y1 to Yn so as to selectively connect the digit line pairs D1/D1B to Dn/DnB to the data bus RB/RBB. When a column decoder (not shown) selectively changes the column selecting lines Y1 to Yn to the active high level, one of the digit line pairs D1/D1B to Dn/DnB is connected through the associated pair of n-channel enhancement type transfer transistors Mn15/Mn16 to the data bus RB/RBB, and the read-out data bit is transferred from the selected digit line pair to the data bus RB/RBB.

The sense amplifier 16 quickly develops the potential difference on the data bus RB/RBB, and an output circuit (not shown) produces an output data signal from the potential difference developed on the data bus RB/RBB. On the other hand, when an input data signal arrives at an input circuit (not shown), the write-in circuit 16 produces a potential difference from the input data signal on the data bus RB/RBB.

When the static random access memory device is requested to read out a data bit from the memory cell MC in the left column to an external device (not shown), the peripheral circuit 11 behaves as follows.

The precharge control line PCL remains in the active high level until selection of the word line WL1, and the positive power supply line VCC charges the digit lines D1/D1B to Dn/DnB through the n-channel enhancement type charge transistors Mn10/Mn11. The column address decoder (not shown) keeps all of the digit line pairs D1/D1B to Dn/DnB inactive low, and the p-channel enhancement type clamping transistors Mp1/Mp2 are turned on so as to connect the constant potential line VR to the digit lines D1/D1B to Dn/DnB. The p-channel enhancement type clamping transistors Mp1/Mp2 fully turned on; however, the n-channel enhancement type charge transistors Mn10/Mn11 are slightly turned on. For this reason, the digit lines D1/D1B to Dn/DnB are regulated to the precharge level equal to the constant potential level Vr.

When the word line WL1 is changed to the active high level, the precharge control line PCL is changed to the inactive low level, and the column address decoder changes the column selecting line Y1 from the low level to the high level.

The precharge control line PCL at the inactive low level causes the n-channel enhancement type charge transistors Mn10/Mn11 and the n-channel enhancement type balance transistor Mn12 to turn off, and the column selecting line Y1 at the high level causes the p-channel enhancement type clamping transistors Mp1/Mp2 to turn off. Then, the digit lines D1/D1B enter into the floating state. However, the other column selecting lines are maintained at the low level, and the other digit line pairs are still at the constant potential level Vr.

The word line WL1 at the active high level causes the n-channel enhancement type access transistors to concurrently turn on, and the first/second memory nodes of the memory cells MC are connected to the digit line pairs D1/D1B to Dn/DnB. One of the digit lines of each pair is electrically connected to the low potential line LP, and the other digit line is electrically connected to the high potential line HP. Then, a potential difference takes place between the digit lines D1 and D1B.

The column selecting line Y1 at the high level causes the n-channel enhancement type transfer transistors Mn15/Mn16 to turn on, and the potential difference on the digit line pair D1/D1B is transferred to the data bus RB/RBB. The sense amplifier 16 develops the potential difference on the data bus RB/RBB, and the output circuit produces the output data signal from the potential difference on the data bus RB/RBB.

Although the digit line pairs D1/D1B to Dn/DnB are in the floating state during the selection of the row of memory cells MC, the adjacent non-selected digit line pairs are clamped at the constant potential level Vr, and noise is negligible.

When a write-in data bit is written into the memory cell MC in the left-most column, the peripheral circuit 11 behaves similar to the data read-out until the selection of the memory cell MC. The write-in circuit 16 decays one of the data bus lines RB/RBB to the low level, and maintains the other data bus line at the positive power voltage level Vcc. The write-in circuit 16 produces a potential difference representative of the write-in data bit on the data bus RB/RBB. The potential difference is transferred from the data bus RB/RBB through the n-channel enhancement type transfer transistors Mn15/Mn16 to the digit line pair D1/D1B. If the write-in data bit is opposite in potential level to the data bit stored in the memory cell MC, the digit line pair D1/D1B inverts the potential difference between the first and second memory nodes in the memory cell MC.

When the potential difference is transferred from the data but lines RB/RBB to the selected digit line pair D1/D1B, the positive power voltage level Vcc on the data bus line is decayed by the n-channel enhancement type transfer transistor Mn15 or Mn16. Thus, the n-channel enhancement type transfer transistor Mn15/Mn16 restricts the potential level on the associated digit line D1 or D1B to (Vcc−Vtn). After the data write-in, the precharge control line PCL is changed to the active high level, and the n-channel enhancement type charge transistors Mn10/Mn11 and the n-channel enhancement type balance transistor Mn12 charge and balance the digit line pairs D1/D1B–Dn/DnB at the precharge level.

Figure 1:
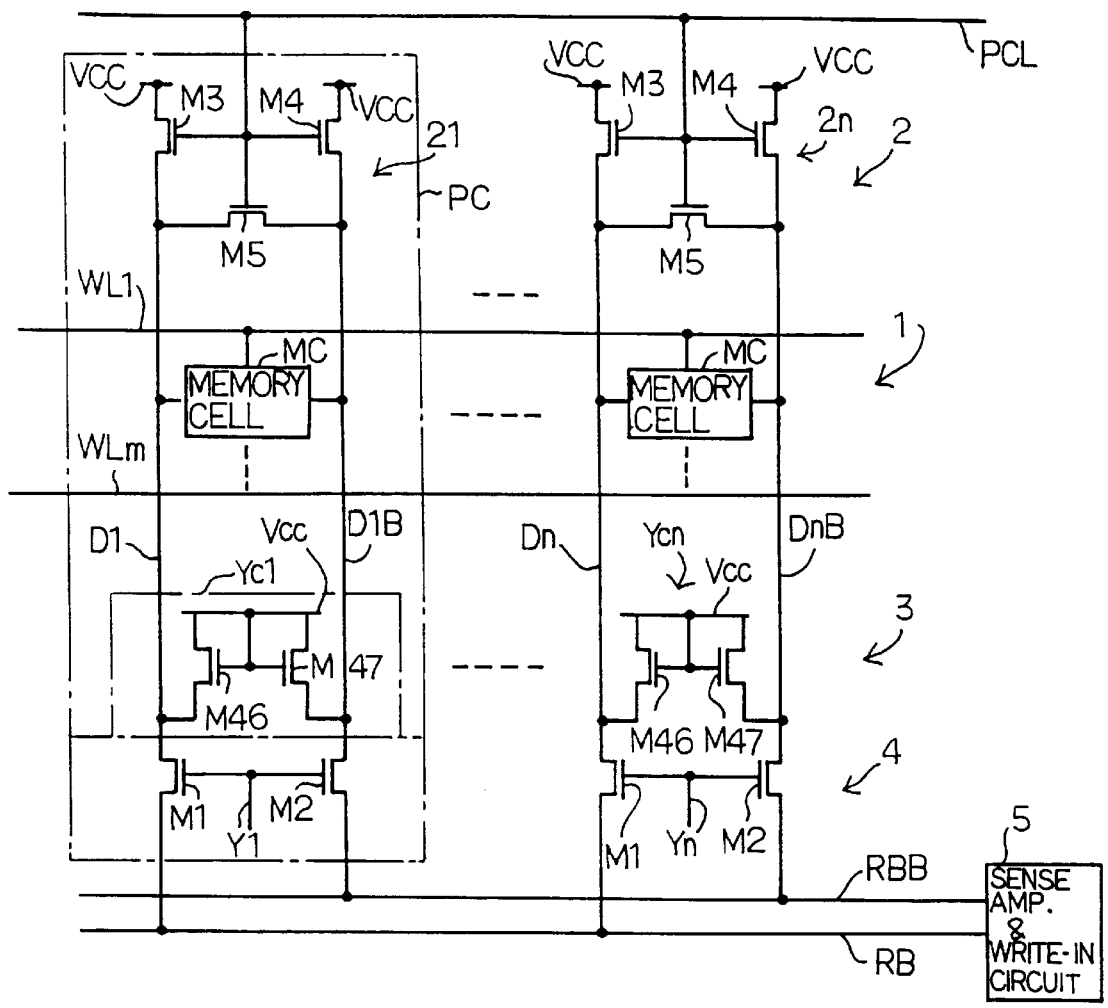
FIG. 1 is a circuit diagram showing the arrangement of the prior art semiconductor memory device.
Figure 5A:
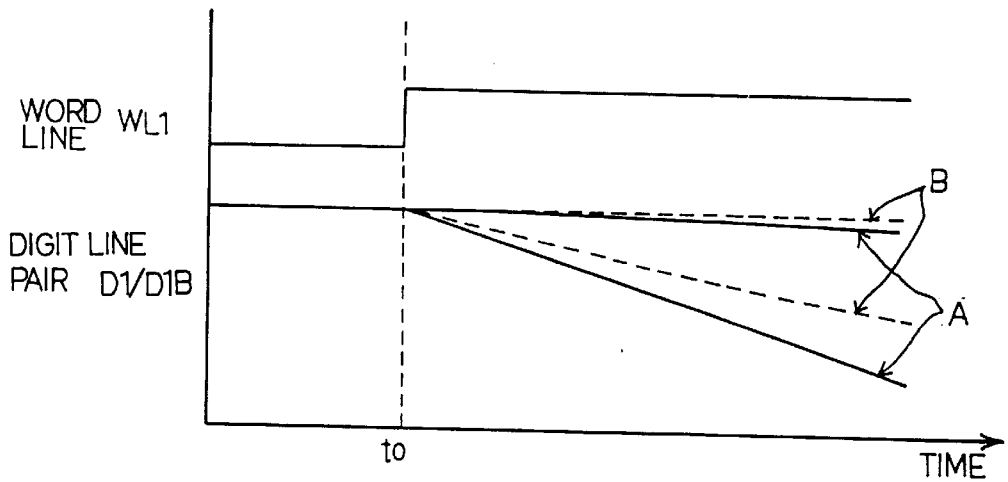
FIG. 5A is a graph showing potential levels on digit lines in a data read-out.

Subsequently, description is made on advantages of the static random access memory device according to the present invention. FIG. 5A illustrates the potential decay on the digit line pair D1/D1B. The word line WL1 is changed to the active high level at time t0, and the digit lines D1/D1B are connected to the first and second memory nodes of the memory cell MC. Plots A is indicative of the potential level on the digit line pair D1/D1B of the static random access memory device according to the present invention, and plots B stands for the digit lines D1/D1B of the prior art static random access memory device. The column selecting signal Y1 causes the p-channel enhancement type clamping transistors Mp1/Mp2 to turn off, and the digit lines D1/D1B are rapidly decayed along plots A. However, the clamping transistors M46/M47 of the prior art (FIG. 1) continuously supply current to the digit lines D1/D1B of the prior static random access memory device, and the digit lines D1/D1B are slowly decay along plots B. Thus, the potential difference in accordance with the invention is developed faster than that of the prior art by virtue of the p-channel enhancement type clamping transistors Mp1/Mp2 controlled by the column selecting lines Y1 to Yn, and the static random access memory device according to the present invention is improved in access speed.

Figure 5B:
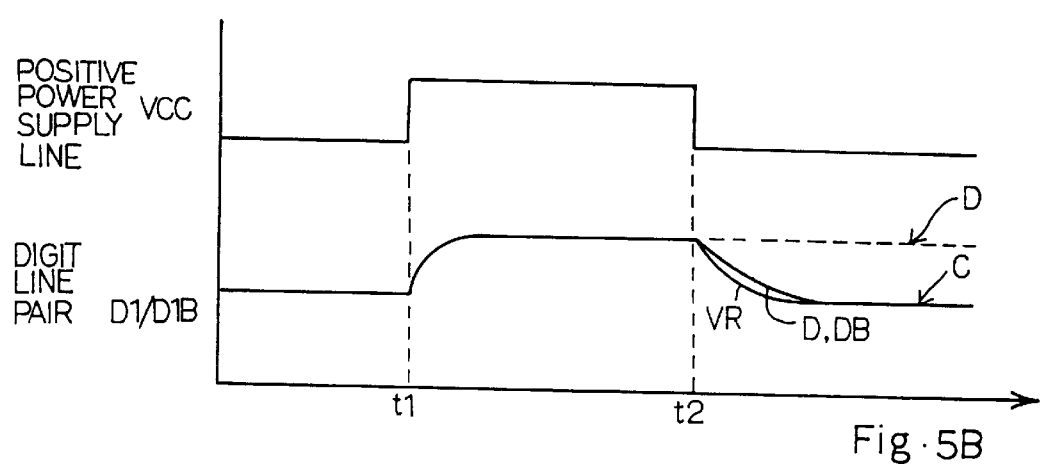
FIG. 5B is a graph showing potential levels on digit lines under a potential fluctuation of a power supply line.

FIG. 5B illustrates the electrical influence on the digit lines when potential fluctuation takes place on the positive power supply line VCC during the precharged state. The positive power supply line VCC rises at time t1, and falls at time t2. The potential fluctuation raises the potential level on the digit line pairs D1/D1B of both static random access memory devices, because the gate-to-source potential difference is increased together with the positive power voltage level Vcc.

Even though the positive power voltage level Vcc is recovered at time t2, the digit line pair D1/D1B of the prior art static random access memory device does not follow the positive power voltage level Vcc, and is maintained at the increased potential level as indicated by plots D. In this situation, even if the word line WL1 connects the digit lines D1/D1B to the memory nodes and the column selecting line Y1 is changed to the active high level, the column selecting signal Y1 can not cause the n-channel enhancement type transfer transistors Mn15/Mn16 to turn on, and the potential fluctuation introduces time delay in the data read-out.

On the other hand, the digit line pair D1/D1B of the present invention follows the positive power voltage level Vcc as indicated by plots C. In detail, when the positive power voltage level Vcc returns to the standard level, the reference level Vref follows the positive power voltage level Vcc, and the operational amplifier OA1 causes the n-channel enhancement type discharging transistor Mn14 to increase the discharging current. For this reason, the constant potential line VR and the digit lines D1/D1B are decayed together with the positive power level Vcc as indicated by plots VR and D,DB. Thus, the constant potential generator 14 decays the undesirably increased potential level on the digit lines D1/D1B, and does not allow the potential fluctuation to introduce time delay in the data read-out.

Figure 5C:
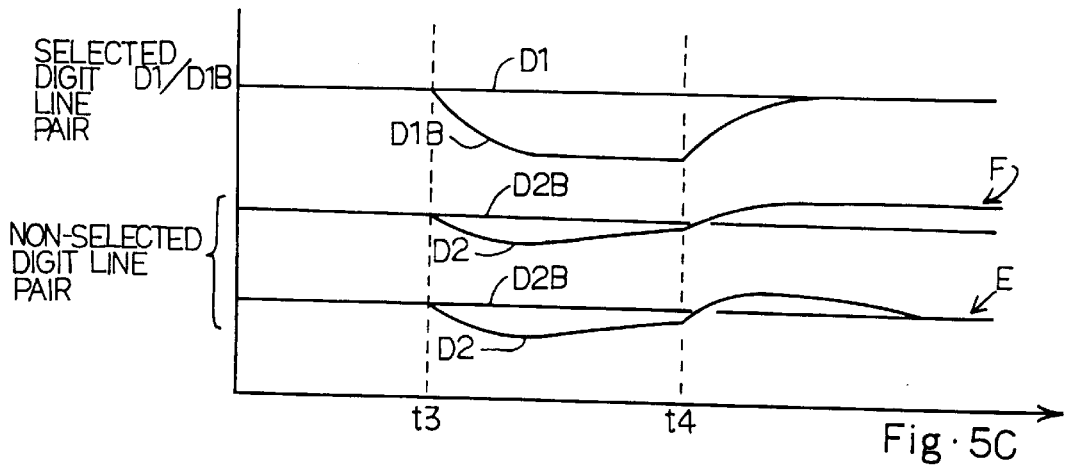
FIG. 5C is a graph showing potential levels on adjacent digit lines capacitively coupled to each other.

FIG. 5C illustrates the potential levels on the selected digit line pair D1/D1B and the potential levels on the non-selected adjacent digit line pair D2/D2B. The static random access memory device of the present invention and the prior art static random access memory device are assumed to start a data write-in at time t3, and the digit line pairs D1/D1B are recovered therefrom at time t4. The digit lines D1B are decayed, and the digit lines D2 are capacitively coupled to the digit lines D1B.

When the digit lines D1B are decayed, the adjacent digit lines D2 follow the digit lines D1B due to the coupling capacitance therebetween. However, the clamping circuit M46 (FIG. 1) supplies current to the digit line D2, and the p-channel enhancement type clamping transistor Mp1 (FIG. 2) supplies current to the digit line D2. For this reason, the digit lines D2 are recovered toward the respective precharge levels.

The digit lines D1B are recovered toward the precharge levels at time t4, and the digit lines D2 are lifted over the precharge levels. Although the digit line D2 of the present invention is recovered to the precharge level as indicated by plots E, the prior art digit line D2 is maintained over the precharge level as indicated by plots F, and is hardly recovered to the precharge level. This is because of the fact that the digit line D2 over the precharge level causes the n-channel enhancement type clamping transistor M46 to turn off. However, the digit lines D2B are not affected by the coupling capacitance, and stay at the respective precharge levels. As a result, an undesirable offset potential is left on only the digit line pair D2/D2B of the prior art static random access memory device.

The balance transistor M5 tries to cancel the offset potential on the digit line pair D2/D2B. However, the high potential level on the digit line D2 makes the current driving capability of the n-channel enhancement type balance transistor M5 small, and the prior art static random access memory device consumes a long time until the recovery to the precharge level.

If the digit line pair D2/D2B is selected in the next data read-out before the cancellation of the offset potential, the selected memory cell MC is expected to firstly cancel the offset potential and, thereafter, produce a potential difference representative of the data bit stored therein. For this reason, the data read-out consumes a long time period. On the other hand, the p-channel enhancement type clamping transistor Mp1 quickly cancels the off set potential, and allows an external device to immediately access a memory cell MC connected to the adjacent digit line pair D2/D2B.

As will be appreciated from the foregoing description, the clamping transistors Mp1/Mp2 opposite in channel conductivity type to the transfer transistors Mn15/Mn16 allow selected memory cells to rapidly produce potential differences on the digit line pairs D1/D1B to Dn/DnB, and quickly cancel offset potential produced on the adjacent digit lines due to the capacitive coupling.

Moreover, the constant potential generator 14 increases the discharging current from the digit line through the p-channel enhancement type clamping transistors Mp1/Mp2 to the ground line GND upon recovery from the potential fluctuation, and puts the digit line pairs in the ready-for-access state immediately after the potential fluctuation on the power supply line VCC.

Second Embodiment

Figure 6:
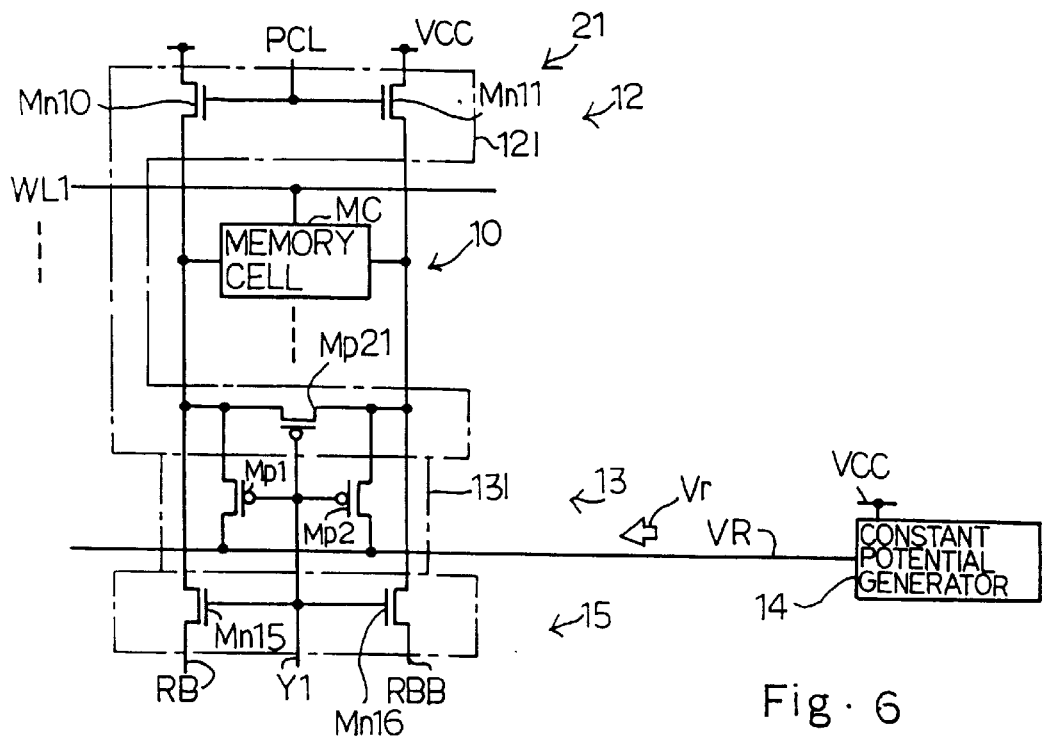
FIG. 6 is a circuit diagram showing the arrangement of another static random access memory device according to the present invention.

FIG. 6 illustrates another static random access memory device embodying the present invention. Only a column of memory cells and a part of a peripheral circuit 21 associated therewith are shown in FIG. 6, and the peripheral circuit 21 is similar to the peripheral circuit 11 except for a p-channel enhancement type balance transistor Mp21. For this reason, the other circuit components are labeled with the same references as corresponding circuit components of the peripheral circuit 11 without detailed description.

The p-channel enhancement type balance transistor Mp21 is connected between the digit lines D1 and D1B of the associated pair, and is gated by the column selecting line Y1.

If noise causes offset potential to take place on the digit line D1 or D1B with respect to the positive power voltage level Vcc, the n-channel enhancement type balance transistor Mn12 (FIG. 2) can not quickly balance the digit lines D1 and D1B. On the other hand, the p-channel enhancement type balance transistor Mp21 fully turns on during the precharging period, and cancels the offset potential in cooperation with the p-channel enhancement type clamping transistor Mp1 or Mp2.

However, the p-channel enhancement type balance transistor Mp21 is less effective in the recovery from the potential difference during the data write-in because one of the digit lines has been in the low level. Thus, there is a trade off between the p-channel enhancement type balance transistor Mp21 and the n-channel enhancement type balance transistor Mn12, and the manufacturer determines the channel conductivity type of the balance transistor in consideration of the influence on the access time.

Third Embodiment

Figure 7:
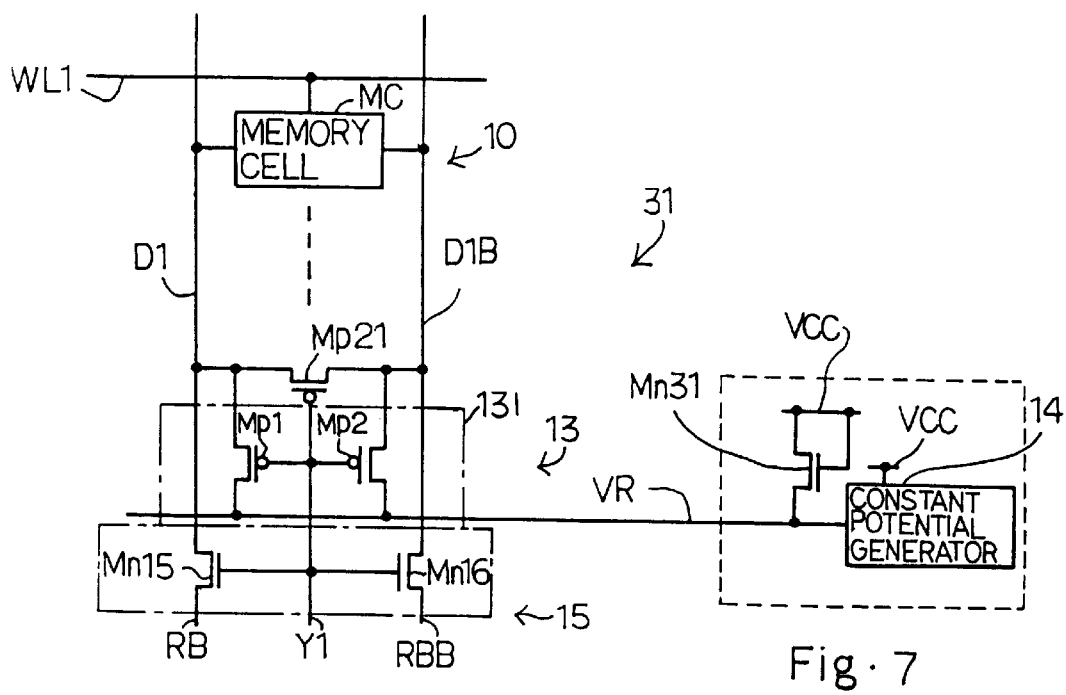
FIG. 7 is a circuit diagram showing the arrangement of yet another static random access memory device according to the present invention.

FIG. 7 illustrates yet another static random access memory device embodying the present invention. Only a column of memory cells and a part of a peripheral circuit 31 associated therewith are shown in FIG. 7. The n-channel enhancement type charge transistors Mn10/Mn11 are deleted from the peripheral circuit 31, and an n-channel enhancement type load transistor Mn31 is connected between the positive power supply line VCC and the constant potential line VR. The other circuit components of the peripheral circuit 31 are similar to those of the peripheral circuit 21, and, for this reason, the other circuit components are labeled with the same references designating corresponding circuit components of the peripheral circuit 21 without detailed description.

The gate electrode of the n-channel enhancement type load transistor Mn31 is connected to the positive power supply line VCC, and the n-channel enhancement type load transistor Mn31 supplies the potential level (Vcc−Vtn) to the constant potential line VR. After a data write-in, the constant potential line VR charges the digit lines D1/D1B to the constant potential level Vr, and the current driving capability is less than that of the n-channel enhancement type charge transistors Mn10/Mn11. For this reason, the recovery after the data write-in consumes much time as compared to the first and second embodiments. However, two n-channel enhancement type field effect transistors are deleted from each digit line pairs of the third embodiment, and the circuit components of the third embodiment are less than those of the first and second embodiments.

Fourth Embodiment

Figure 8:
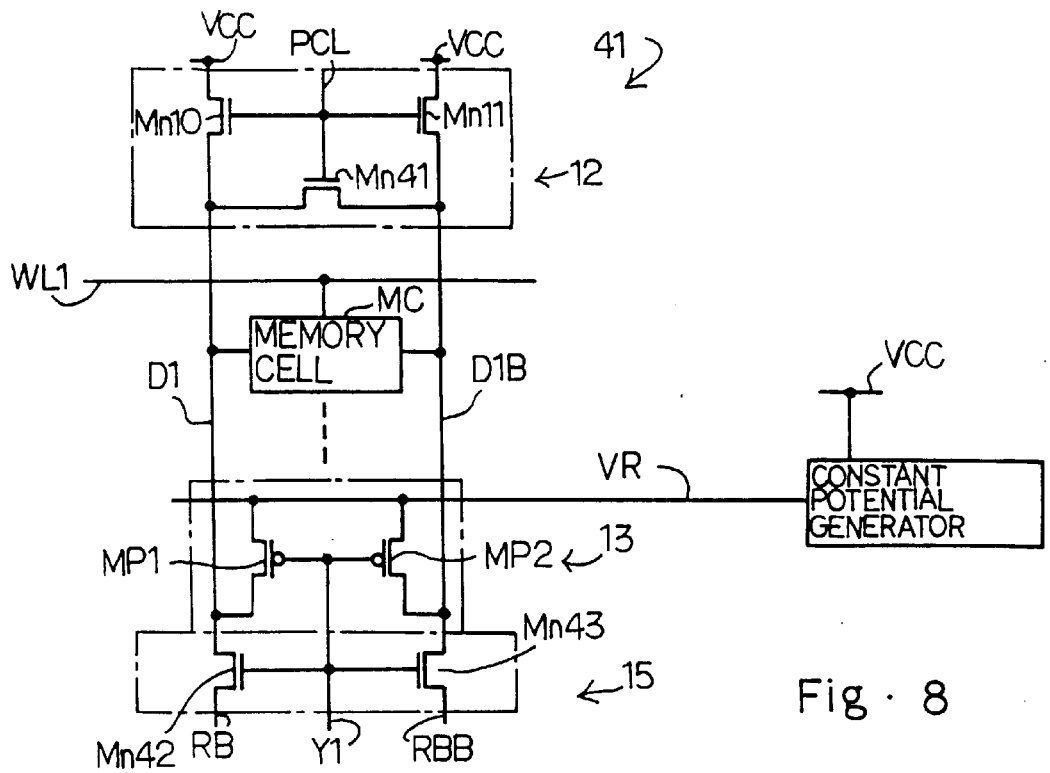
FIG. 8 is a circuit diagram showing the arrangement of still another static random access memory device according to the present invention.

FIG. 8 illustrates still another static random access memory device embodying the present invention. Only a column of memory cells and a part of a peripheral circuit 41 associated therewith are shown in FIG. 8, and the peripheral circuit 41 is similar to the peripheral circuit 11 except for an n-channel enhancement type balance transistor Mn41 and n-channel enhancement type transfer transistors Mn42/Mn43. For this reason, the other circuit components are labeled with the same references designating corresponding circuit components of the peripheral circuit 11 without detailed description.

The n-channel enhancement type balance transistor Mn41 and the n-channel enhancement type transfer transistors Mn42/Mn43 are smaller in threshold than that of the other n-channel enhancement type charge transistors Mn10/Mn11.

When the memory cell MC develops the potential difference on the digit lines D1/D1B, one of the digit lines D1/D1B is in the potential level (Vcc−Vtn), and the gate-to-source potential of the n-channel enhancement type transfer transistors Mn15/Mn16 is close to the threshold Vtn. For this reason, the current driving capability of the n-channel enhancement type transfer transistors Mn15/Mn16 is not so large, and the n-channel enhancement type transfer transistors Mn15/Mn16 consume a long time period for transferring the potential difference. However, the n-channel enhancement type transfer transistors Mn42 and Mn43 fully turn on, and rapidly transfer the potential difference to the data bus RB/RBB.

The n-channel enhancement type balance transistor Mn12 has small current driving capability. When the n-channel enhancement type charge transistors Mn10/Mn11 have a threshold smaller than the designed value, the precharge unit 121 takes a long time period. However, the n-channel enhancement type balance transistor Mn41 is smaller in threshold than the n-channel enhancement type balance transistor Mn12, and the n-channel enhancement type balance transistor Mn41 rapidly balances the digit lines D1 and D1B. The decrement of the threshold is determined on the basis of the dispersion of the threshold of the n-channel enhancement type charge transistors Mn10/Mn11.

Fifth Embodiment

Figure 9:
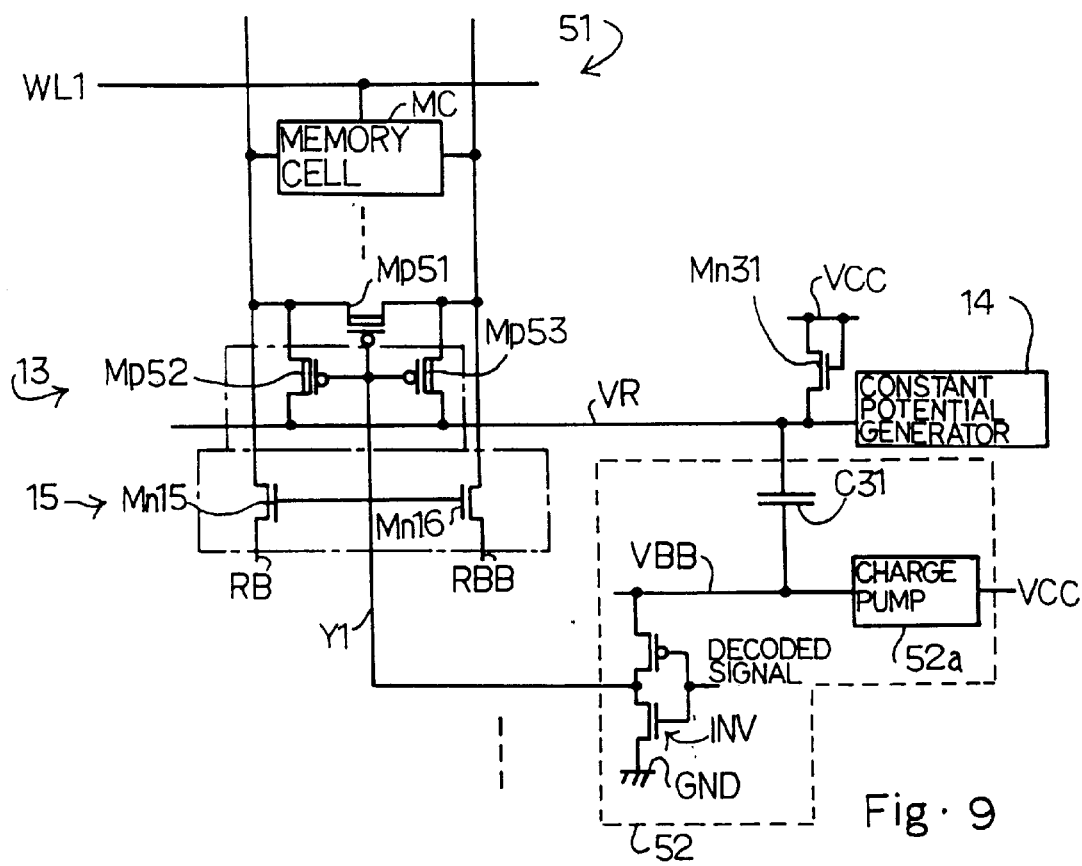
FIG. 9 is a circuit diagram showing the arrangement of another static random access memory device according to the present invention.

FIG. 9 illustrates another static random access memory device embodying the present invention. Only a column of memory cells and a part of a peripheral circuit 51 associated therewith are shown in FIG. 9, and the peripheral circuit 51 is similar to the peripheral circuit 31 except for a p-channel depletion type balance transistor Mp51, p-channel depletion type clamping transistors Mp52/Mp53 and a column address decoder 52. For this reason, the other circuit components are labeled with the same references as corresponding circuit components of the peripheral circuit 31 without detailed description.

The column address decoder 52 includes a driver circuit implemented by an inverter INV, and the inverter INV is connected between a boosted potential supply line VBB and the ground line GND. A charge pump circuit 52a is connected to the boosted potential line VBB, and a capacitor C31 is connected between the constant potential line VR and the boosted potential line VBB. The charge pump circuit 52a produces a boosted potential level several volts higher than the positive power voltage level Vcc. For this reason, when the digit line pair D1/D1B is selected, the column selecting line Y1 is changed to the boosted potential level, and the boosted potential level is supplied to the gate electrodes of the n-channel enhancement type transfer transistors Mn15/Mn16 and the gate electrodes of the p-channel depletion type balance/clamping transistors Mp51/Mp52/Mp53.

The boosted potential level is higher than the positive power voltage level Vcc, and increases the current driving capability of the n-channel enhancement type transfer transistors Mn15/Mn16. Moreover, the boosted potential level makes the off level of the p-channel transistors Mp51/Mp52/Mp53 high, and the high off level is equivalent to an increased transistor in the on-state as shown in |Gate Potential (Vg)−Threshold (Vtp)|. This results in a positive threshold Vtp, and the balance/clamping transistors operate in the depletion mode.

The p-channel depletion type balance/clamping transistors Mp51 to Mp53 have large current driving capability, and improve the data access speed.

Although particular embodiments of the present invention have been shown and described, it will be obvious to those skilled in the art that various changes and modifications may be made without departing from the spirit and scope of the present invention.

For example, the word lines may be driven with a pulse for a short time period. In this instance, there is no problem due to the saturated potential in a long cycle.

The data bus RB/RBB may be clamped at the constant potential level Vr. In this instance, the potential difference is smoothly propagated from the selected digit line pair to the data bus RB/RBB. If the word lines WL1 to WLm and the column selecting lines Y1 to Yn are selectively driven with pulse signals, the n-channel enhancement type access transistors and the n-channel enhancement type transfer transistors Mn15/Mn16 are turned off during the precharging, and the p-channel enhancement type clamping transistors Mp1/Mp2 participate the precharging operation.

What is claimed is:

1. A semiconductor memory device comprising:

a plurality of memory cells for storing data bits;

a plurality of word lines selectively connected to said plurality of memory cells for selecting memory cells from said plurality of memory cells;

a plurality of digit line pairs selectively connected to said plurality of memory cells for propagating potential differences representative of data bits from and to said memory cells;

a data bus electrically connectable to one of said plurality of digit line pairs; and a peripheral circuit associated with said plurality of digit line pairs for reading out said data bits from and writing said data bits into said memory cells, and including a column selector having first transistors of a first channel conductivity type connected between the digit lines of said plurality of digit line pairs and said data bus and gated by column selecting signals for connecting one of said plurality of digit line pairs to said data bus, and a clamping circuit having second transistors of a second channel conductivity type opposite to said first channel conductivity type, connected between said digit lines of said plurality of digit line pairs and a constant potential line and gated by said column selecting signals so that said first transistors and said second transistors complementarily turn on and off; and wherein said peripheral circuit further includes a precharge circuit having third transistors of said first channel conductivity type connected between a power supply line and said digit lines of said plurality of digit line pairs and responsive to a precharge control signal for charging said digit lines to a first potential level, and a constant potential generating circuit connected to said constant potential line and discharging current from said digit lines through said clamping circuit and said constant potential line to a discharging line so that said first potential level is different from a difference between a power voltage level on said power supply line and a threshold of said third transistors.

2. The semiconductor memory device as set forth in claim 1, in which said first and third transistors and said second transistors are an n-channel enhancement type and a p-channel enhancement type, respectively, and said first potential level is lower than said difference.

3. The semiconductor memory device as set forth in claim 1, in which said precharge circuit further includes fourth transistors each connected between the digit lines of one of said plurality of digit line pairs for balancing said digit lines at said first potential level.

4. The semiconductor memory device as set forth in claim 3, in which said fourth transistors are gated with said precharge control signal, said third transistors and said fourth transistors are an n-channel enhancement type, and said first transistors and said fourth transistors have respective thresholds smaller than the threshold of said third transistors.

5. The semiconductor memory device as set forth in claim 3, in which said fourth transistors are gated with said column selecting signals, said first and third transistors and said second and fourth transistors are an n-channel enhancement type and a p-channel enhancement type, respectively.

6. The semiconductor memory device as set forth in claim 1, in which said constant potential generating circuit includes
 a reference potential generator connected between said power supply line and said discharge line for producing a second potential level lower than said power voltage level by said threshold at an output node thereof, and
 a potential regulator connected between said constant potential line and said discharge line and comparing said first potential level on said constant potential line with said second potential level so as to control the amount of said current flowing into said discharge line.

7. The semiconductor memory device as set forth in claim 6, in which said constant potential generating circuit further includes a first capacitor connected between said power supply line and said constant potential line and a second capacitor connected between said power supply line and said output node of said reference potential generator.

8. The semiconductor memory device as set forth in claim 1, in which said plurality of memory cells are a static random access type.

9. A semiconductor memory device comprising:
 a plurality of memory cells for storing data bits;
 a plurality of word lines selectively connected to said plurality of memory cells for selecting memory cells from said plurality of memory cells;
 a plurality of digit line pairs selectively connected to said plurality of memory cells for propagating potential differences representative of data bits from and to said memory cells;
 a data bus electrically connectable to one of said plurality of digit line pairs; and
 a peripheral circuit associated with said plurality of digit line pairs for reading out said data bits from and writing said data bits into said memory cells, and including
  a column selector having first transistors of a first channel conductivity type connected between the digit lines of said plurality of digit line pairs and said data bus and gated by column selecting signals for connecting one of said plurality of digit line pairs to said data bus, and
  a clamping circuit having second transistors of a second channel conductivity type opposite to said first channel conductivity type, connected between said digit lines of said plurality of digit line pairs and a constant potential line and gated by said column selecting signals so that said first transistors and said second transistors complementarily turn on and off; and wherein said peripheral circuit further includes a constant potential generating circuit connected to said constant potential line and discharging current from said digit lines through said clamping circuit and said constant potential line to a discharging line,
  third transistors each connected between the digit lines of one of said plurality of digit line pairs for balancing said digit lines at a first potential level, and
  a load transistor connected between a power supply line and said constant potential line.

10. The semiconductor memory device as set forth in claim 9, in which said first transistors and said load transistor are an n-channel enhancement type, said second transistors and said third transistors are a p-channel enhancement type, and said third transistors are gated with said column selecting signals so as to be changed between on-state and off-state complementarily to said first transistors.

11. The semiconductor memory device as set forth in claim 9, in which said first transistors and said load transistor are an n-channel enhancement type, said second transistors and said third transistors are a p-channel depletion type, and said third transistors are gated with said column selecting signals boosted over a power voltage level.

12. The semiconductor memory device as set forth in claim 9, in which said plurality of memory cells are a static random access type.

13. A semiconductor memory device comprising:
 a plurality of memory cells for storing data bits;
 a plurality of word lines selectively connected to said plurality of memory cells for selecting memory cells from said plurality of memory cells;
 a plurality of digit line pairs selectively connected to said plurality of memory cells for propagating potential differences representative of data bits from and to said memory cells;
 a data bus electrically connectable to one of said plurality of digit line pairs; and
 a peripheral circuit associated with said plurality of digit line pairs for reading out said data bits from and writing said data bits into said memory cells, and including
  a column selector having first transistors of a first channel conductivity type connected between the digit lines of said plurality of digit line pairs and said data bus and gated by column selecting signals for connecting one of said plurality of digit line pairs to said data bus;
  a clamping circuit having second transistors of a second channel conductivity type opposite to said first channel conductivity type, connected between said digit lines of said plurality of digit line pairs and a constant potential line and gated by said column selecting signals so that said first transistors and said second transistors complementarily turn on and off;
  a precharge circuit for charging said digit lines, said precharge circuit connected between a power supply line and said digit lines of said plurality of digit line pairs and responsive to a precharge control signal for charging said digit lines; and
  a constant potential generating circuit connected to said constant potential line and discharging current from said digit lines through said clamping circuit and said constant potential line, said constant potential line at a potential lower than said power supply line.

14. The semiconductor memory device as recited in claim 13 wherein said precharge circuit comprises a third transistor and wherein said constant potential line is at a potential lower than said power supply line minus a voltage threshold drop across said third transistor.

15. A semiconductor memory device comprising:

a plurality of memory cells for storing data bits;

a plurality of word lines selectively connected to said plurality of memory cells for selecting memory cells from said plurality of memory cells;

a plurality of digit line pairs selectively connected to said plurality of memory cells for propagating potential differences representative of data bits from and to said memory cells;

a data bus electrically connectable to one of said plurality of digit line pairs; and a peripheral circuit associated with said plurality of digit line pairs for reading out said data bits from and writing said data bits into said memory cells, and including a column selector having first transistors of a first channel conductivity type connected between the digit lines of said plurality of digit line pairs and said data bus and gated by column selecting signals for connecting one of said plurality of digit line pairs to said data bus;

a clamping circuit having second transistors of a second channel conductivity type opposite to said first channel conductivity type, connected between said digit lines of said plurality of digit line pairs and a constant potential line and gated by said column selecting signals so that said first transistors and said second transistors complementarily turn on and off; and a precharge circuit for charging said digit lines, said precharge circuit connected between a power supply line and said digit lines of said plurality of digit line pairs and responsive to a precharge control signal for charging said digit lines, said precharge control signal separate from said column select signal and operative to disconnect said plurality of digit line pairs from said power supply line during a data read operation.

16. The semiconductor memory device as recited in claim 15 wherein said peripherial circuit further includes a constant potential generating circuit connected to said constant potential line and discharging current from said digit lines through said clamping circuit and said constant potential line, said constant potential line at a potential lower than said power supply line.

17. A semiconductor memory device comprising:

a plurality of memory cells for storing data bits;

a plurality of word lines selectively connected to said plurality of memory cells for selecting memory cells from said plurality of memory cells;

a plurality of digit line pairs selectively connected to said plurality of memory cells for propagating potential differences representative of data bits from and to said memory cells;

a data bus electrically connectable to one of said plurality of digit line pairs; and a peripheral circuit associated with said plurality of digit line pairs for reading out said data bits from and writing said data bits into said memory cells, and including a column selector having first transistors of a first channel conductivity type connected between the digit lines of said plurality of digit line pairs and said data bus and gated by column selecting signals for connecting one of said plurality of digit line pairs to said data bus;

a clamping circuit having second transistors of a second channel conductivity type opposite to said first channel conductivity type, connected between said digit lines of said plurality of digit line pairs and a constant potential line and gated by said column selecting signals so that said first transistors and said second transistors complementarily turn on and off; and a precharge circuit having third transistors of said first channel conductivity type connected between a power supply line and said digit lines of said plurality of digit line pairs and responsive to a precharge control signal for charging said digit lines, said column select signal and said precharge control signal turning off said second and third transistors respectively during a data read operation.

18. The seimconductor memory device as recited in claim 17 wherein said peripherial circuit further includes a constant potential generating circuit connected to said constant potential line and discharging current from said digit lines through said clamping circuit and said constant potential line, said constant potential line at a potential lower than said power supply line.

* * * * *